(12) United States Patent
Tanatar et al.

(10) Patent No.: US 8,450,246 B2
(45) Date of Patent: May 28, 2013

(54) LOW RESISTIVITY CONTACT TO IRON-PNICTIDE SUPERCONDUCTORS

(75) Inventors: Makariy Tanatar, Ames, IA (US); Ruslan Prozorov, Ames, IA (US); Ni Ni, Ames, IA (US); Sergey Bud'ko, Ames, IA (US); Paul Canfield, Ames, IA (US)

(73) Assignee: Iowa State University Research Foundation, Inc., Amos, IA (US)

( * ) Notice: Subject to any disclaimer, the term of this patent is extended or adjusted under 35 U.S.C. 154(b) by 0 days.

(21) Appl. No.: 12/931,999

(22) Filed: Feb. 15, 2011

(65) Prior Publication Data

US 2011/0212841 A1   Sep. 1, 2011

Related U.S. Application Data

(60) Provisional application No. 61/338,832, filed on Feb. 24, 2010.

(51) Int. Cl.
  *H01L 39/24*   (2006.01)
(52) U.S. Cl.
  USPC ........................................ 505/100; 505/190
(58) Field of Classification Search
  USPC ................. 505/100, 190; 423/263, 299, 462, 423/467, 508, 511
  See application file for complete search history.

(56) References Cited

U.S. PATENT DOCUMENTS

| | | | | |
|---|---|---|---|---|
| 3,593,110 A | * | 7/1971 | Huebener | 322/2 R |
| 3,621,386 A | * | 11/1971 | Purcell | 324/693 |
| 4,161,062 A | * | 7/1979 | Agatsuma et al. | 29/599 |
| 4,600,802 A | * | 7/1986 | Ihas et al. | 174/15.4 |
| 4,966,142 A | * | 10/1990 | Zimmerman et al. | 228/262.9 |
| 5,079,223 A | | 1/1992 | Maroni | 505/1 |
| 5,098,656 A | * | 3/1992 | Zimmerman et al. | 420/526 |
| 5,149,686 A | | 9/1992 | Ekin et al. | 505/1 |
| 5,179,071 A | | 1/1993 | Ekin et al. | 505/1 |
| 5,179,075 A | | 1/1993 | Leriche et al. | 505/1 |
| 5,296,459 A | | 3/1994 | Negm et al. | 505/1 |
| 5,308,831 A | * | 5/1994 | Fevrier et al. | 505/100 |
| 5,480,728 A | | 1/1996 | Tkaczyk | 428/548 |
| 5,506,199 A | | 4/1996 | Bock et al. | 505/450 |
| 6,921,865 B2 | | 7/2005 | Morita et al. | 174/125.1 |
| 7,126,060 B2 | * | 10/2006 | Morita | 174/126.2 |
| 8,055,318 B1 | * | 11/2011 | Kadin | 505/190 |
| 2008/0318793 A1 | * | 12/2008 | Somerkoski | 505/162 |
| 2010/0173784 A1 | * | 7/2010 | Lee et al. | 505/237 |

FOREIGN PATENT DOCUMENTS

CN        101383204 A   *   3/2009
WO   WO2009/135348 A1  *  12/2009

OTHER PUBLICATIONS

R. Prozorov, et al., Vortex phase diagram of $Ba(Fe_{0.93}Co_{0.07})_2As_2$ single crystals, Physical Review B 78, 224506 (2008).
S. Mukhopadhyay, et al., Magnetic impurities in the pnictide superconductor $Ba_{1-x}K_xFe_2As_2$, New Journal of Physics 11, 2009.
N. Ni, et al., Anisotropic thermodynamic and transport properties of single-crystalline $Ba_{1-x}K_xFe_2As$ (x=0 and 0.45), Physical Review B 78, 014507 (2008).

* cited by examiner

*Primary Examiner* — Colleen Dunn

(57) ABSTRACT

Method of making a low resistivity electrical connection between an electrical conductor and an iron pnictide superconductor involves connecting the electrical conductor and superconductor using a tin or tin-based material therebetween, such as using a tin or tin-based solder. The superconductor can be based on doped $AFe_2As_2$, where A can be Ca, Sr, Ba, Eu or combinations thereof for purposes of illustration only.

16 Claims, 4 Drawing Sheets

LOW RESISTIVITY CONTACT TO IRON-PNICTIDE SUPERCONDUCTORS

This application claims benefits and priority of U.S. provisional application Ser. No. 61/338,832 filed Feb. 24, 2010, the disclosure of which is incorporated herein by reference.

CONTRACTUAL ORIGIN OF THE INVENTION

This invention was made with government support under Contract No. DE-AC02-07CH11358 from the Department of Energy. The government has certain rights in the invention.

FIELD OF THE INVENTION

The present invention relates to a low resistivity electrical contact to a superconductor and, more particularly, to a low resistivity electrical contact to an iron-pnictide superconductor and to a contact making method.

BACKGROUND OF THE INVENTION

Superconductors are materials which carry electrical current without dissipation. However, feeding electrical current into a superconductor generates heat dissipation in the contacts and degrades maximum attainable current value. This degradation can be minimized by creating electrical contacts with low resistance.

The superconducting state is destroyed if the parameters of the experiment exceed some critical values. These are critical temperature $T_c$ and critical magnetic fields, the higher of which called the upper critical field, $H_{c2}$ destroys superconducting state completely. The maximum density of current which the superconductor can carry without dissipation is called critical current density $J_c$. This value, in addition to temperature and magnetic field, depends on both intrinsic properties of materials used and the form of their preparation.

There is an ongoing effort to find superconductors with high intrinsic critical parameters. Discovery of superconductors with high transition temperatures, well exceeding the boiling point of liquid hydrogen, 20 K, opens the way for using high temperature superconductors for a variety of application. Just a few superconductors are known with transition temperatures on the order of 40 K, offering prospective for technological applications at 20 K. These include numerous compounds based on copper oxides and generally referred to as superconducting cuprates ($T_c$ up to 135 K at ambient pressure) and $MgB_2$ ($T_c$=39K). A new family of materials based on iron-arsenide compounds known as iron pnictides, which are generally represented by $AFe_2As_2$ where A can be Ca, Sr, Ba or combinations thereof, offer a number of superior material parameters as compared to the cuprates. These include low anisotropy of the upper critical fields, high values of the upper critical field and small anisotropy of the superconducting critical currents.

Superconductivity can be induced in the iron pnictides by partial chemical (elemental) substitution (doping) of either of the three elemental constituents (A, Fe, As) and/or by application of pressure. Substituted iron pnictides can be represented by $(A_{1-x}D1_x)(Fe_{1-y}D2_y)_2(As_{1-z}D3_z)_2$, where A stands for alkali earth elements Ca, Sr, Ba, Eu or their combinations, and various elements can be added as dopants D1, D2 and D3.

Superconducting materials based on K-, P-, Co-, or Ni-doped $BaFe_2As_2$, with high transition temperatures to the superconducting state (above 20 K) were discovered in mid-2008 and their electrical properties were tested using commonly accepted in-laboratory electrical contact making techniques that involved attaching electrical conductor wires (e.g. silver wires) to the superconductor using silver epoxies or silver paint. However, these electrical connections were characterized by high contact resistance on the order of $10^{-3}$ ohm-$cm^2$, and are not suitable for high current applications.

Feeding of electrical current into the superconductor generates heat dissipation in the contacts and degrades maximum attainable current value. This degradation can be minimized by creating contacts with low resistance. However, the selection of contact materials heavily depends on the surface reactivity of the materials in contact. For unknown material, determination of right combination is impossible without heavy experimenting. For example, Indalloy Corporation provides a research soldering kit, targeting soldering non-standard metals. The number of alloys in the kit is above 280, which go in combination with 5 different fluxes. This gives more than 1400 combinations to test. Even when a mechanically strong soldered joint is made, there is absolutely no guarantee that it would give suitable contact resistance. The same is true with different approaches, used for contact making. These include, but are not limited to, different variants of vacuum evaporation (thermal, plasma, reactive magnetron sputtering, laser ablation). During contact making, new binary and ternary compounds are easily formed at the interface, which adds to the poor predictability of the contact electrical performance.

SUMMARY OF THE INVENTION

The present invention provides in an embodiment a method for making one or more low resistivity contacts to iron pnictide superconductors, such as for purposes of illustration and not limitation, those based on doped $AFe_2As_2$, where A can be Ca, Sr, Ba, Eu, or combinations thereof, as well as the electrical contact produced. The electrical contact is characterized by low surface contact resistivity suitable for use in both low and high current applications.

In an illustrative embodiment of the invention, an electrical conductor is connected to a surface of an iron pnictide superconductor using tin (Sn) or a tin-based material, such as a tin solder or tin-based solder, to provide a low resistivity electrical contact. The tin-based material can comprise a tin-silver alloy, a tin-copper alloy, a tin-lead alloy, or a ternary tin-silver-copper alloy. For purposes of illustration and not limitation, a low contact surface resistivity on the order of $10^{-9}$ ohm-$cm^2$ can be provided by practice of the invention.

Other advantages of the present invention will become apparent from the following drawings taken with the following detailed description.

DETAILED DESCRIPTION OF THE INVENTION

Figure 1:
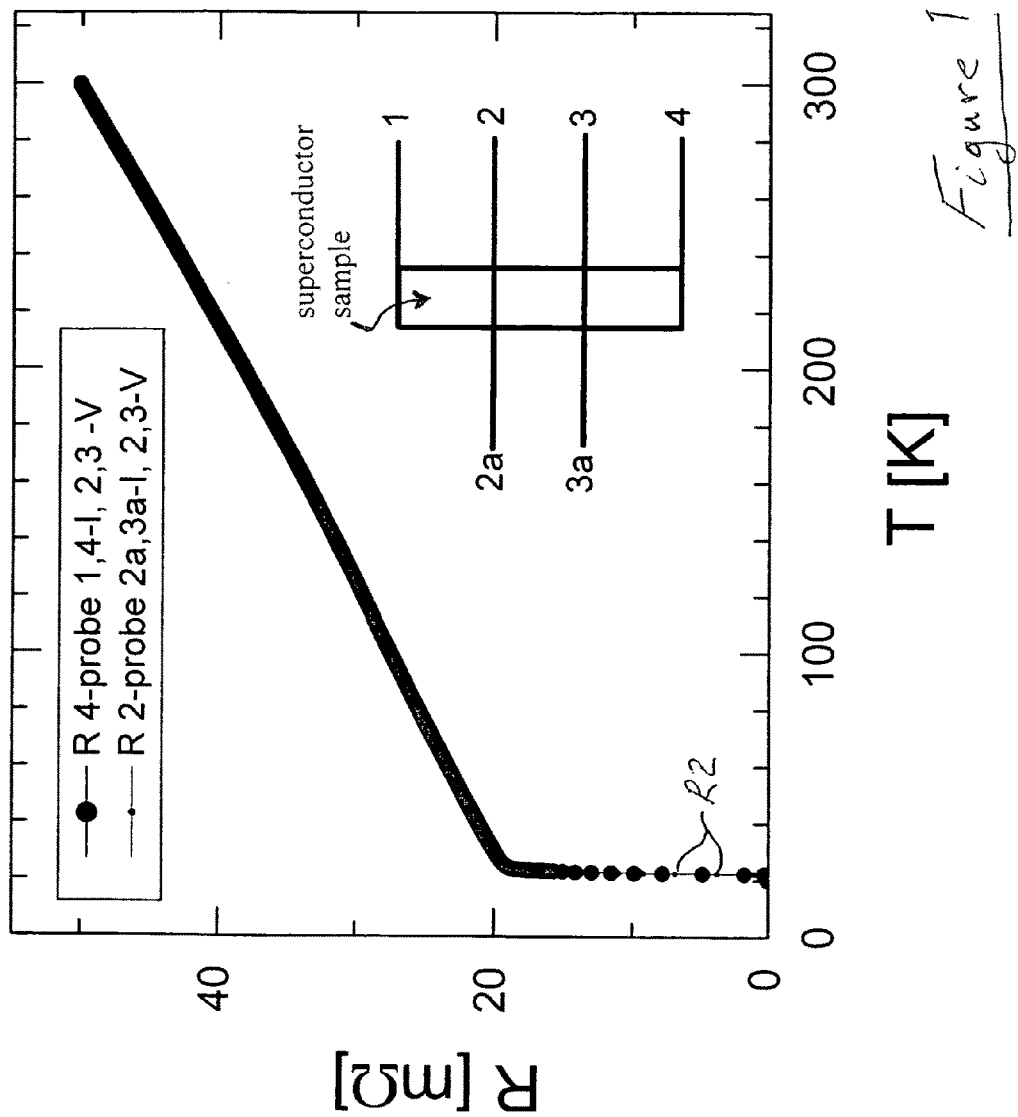
FIG. 1 is a graph of temperature dependence of resistance measured using two different contact configurations. In a usual four-probe scheme current was flowing between contacts 1 and 4, and potential drop was measured between contacts 2 and 3, in a 2-probe scheme current was flowing between contacts 2a and 3a, and voltage was measured between contacts 2 and 3.

An illustrative embodiment of the invention provides a method for making one or more low resistivity electrical contacts to iron pnictide superconductors which are represented by general formula $(A_{1-x}D1_x)(Fe_{1-y}D2_y)_2(As_{1-z}D3_z)_2$ wherein A comprises an alkali earth element selected from the group consisting of Ca, Sr, Ba, Eu, and combinations thereof and x is 0 to 1, y is 0 to 0.4 where y can be 0 to 0.2 in some particular embodiments, and z is 0 to 0.6. The element (e.g. dopant) D1 can be selected from the group consisting of Na, K, Rb, Cs and combinations thereof and can be present singly or collectively (if more than one is present) in an amount up to 100 atomic % on the alkali earth site of the superconductor material. Dopant D2 can be selected from the group consisting of Co, Ni, Pd, Rh, Ru, Pt and combinations thereof and can be present singly or collectively (if more than one is present) in an amount up to 20 atomic % on the iron site of the superconductor material. The element (dopant) D3 can be selected from the group consisting of P, Te, S, Se, Sb, Bi and combinations thereof and can be present singly or collectively (if more than one is present) in an amount up to 60 atomic % on the pnictide site of the superconductor material. The contact can be made from a tin-based alloy having a majority (greater than 50% by weight) of tin and that can include a minor amount of an element selected from the group consisting of Bi, Al, In, Pb, Ag, Au, Cu, Cd, Sb, and Zn or their combinations to improve the mechanical or soldering properties of the electrical contact and to improve a joint to the metallic conductor.

In a particular illustrative embodiment of the invention, the superconductor is represented by doped $AFe_2As_2$ with the general formula $(A_{1-x}D1_x)(Fe_{1-y}D2_y)_2(As_{1-z}D3_z)_2$, where A can be selected from the group consisting of Ca, Sr, Ba and Eu and combinations thereof, as well as the electrical contact produced, wherein an electrical contact is produced having low surface contact resistivity suitable for use in both low and high current applications.

The electrical conductor comprises a metallic electrical conductor which can include, but is not limited to, a metallic wire, metallic strip, metallic strap or other shape of an electrical conductor. The electrical conductor can include, but is not limited to, metallic conductors comprising Ag, Ag alloys, Cu, Cu alloys, Au, and Au alloys, and Al and Al alloys.

Pursuant to practice of the invention, the electrical conductor and the superconductor are electrically connected using tin (Sn) or a tin-based material, such as tin solder or tin-based solder wherein a tin-based solder material comprises a majority (i.e. 50% or more by weight) of tin in its composition. Ultrahigh purity tin solder comprising 99.999% by weight tin can be used in practice of the invention to provide a low resistivity electrical contact. Also, tin-based materials comprising an alloy of tin and lead, an alloy of tin and silver, and an alloy of tin and copper, and ternary alloys can be used in practice of the invention to provide a low resistivity electrical contact. For purposes of illustration and not limitation, a Sn—Ag solder having 3.5 weight % Ag and balance Sn can be used in practice of the invention. Also, a Sn—Pb solder having 37 weight % Pb and balance Sn can be used in practice of the invention. An illustrative ternary Sn—Ag—Cu solder alloy is described below.

In practice of the invention wherein the electrical conductor and a surface of the superconductor are connected by a tin or tin-based solder, a suitable soldering flux can be used which will permit a low resistivity electrical contact to be made. Suitable solder fluxes include, but are not limited to, commercially available Castolin 157 flux, Indalloy 2 flux and HCl.

The following examples are offered to illustrate, but not limit, embodiments of the present invention. In particular, electrical contacts to doped $AFe_2As_2$ were made using soldering techniques. A number of different solder alloys and fluxes summarized in Table 1 were tested and the measured surface resistivity $\rho\square$ of the contacts (given as the contact resistance R divided by the contact area) are set forth in Table 1.

FIG. 1 shows the temperature dependence of electrical resistance measured on the sample of $Ba(Fe_{0.926}Co_{0.074})_2As_2$, in which superconductivity with $T_c=23K$ was induced by partial substitution of Fe by Co. The contacts were made by soldering silver wires to the clean surface of the $Ba(Fe_{0.926}Co_{0.074})_2As_2$ single crystal with the help of high purity (99.99%) tin solder. Contact resistance was measured in two ways. First, a 4-probe configuration (FIG. 1) was used, with current flowing between contacts 1-4 and potential drop measured between contacts 2-3. Second, current was flowing through the contacts 2a and 3a, while potential was measured between contacts 2 and 3. The difference between these two measurements is caused by the fact that in the 2-probe measurement, potential difference includes voltage drop in the contact due to finite contact resistance. As can be seen, the two measurements give almost identical results, beyond the resolution of this experiment, set by a slight difference of current distribution in two sets of measurements. The contact resistance is shown to be definitely below 100 $\mu\Omega$. However, because of its very small value it was difficult to measure it precisely in this geometry.

Figure 2:
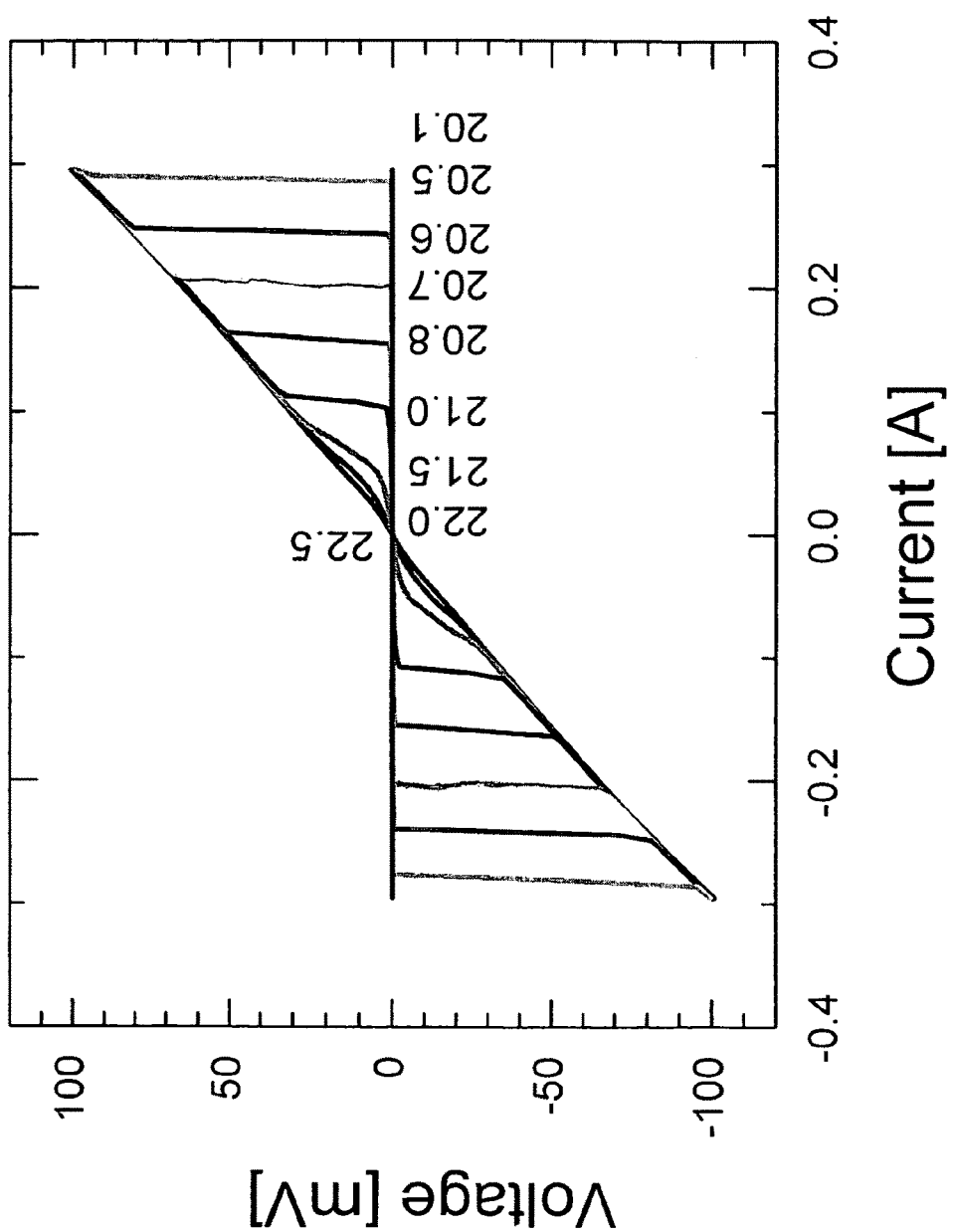
FIG. 2 is a graph of voltage measured between contacts 2 and 3 (see inset in FIG. 1) as a function of current passing between contacts 2a and 3a. Above T, the curves are linear, reflecting Ohm's law. Below $T_c$ the curves reveal broad plateau extending up to the critical current $I_c$.
Figure 3:
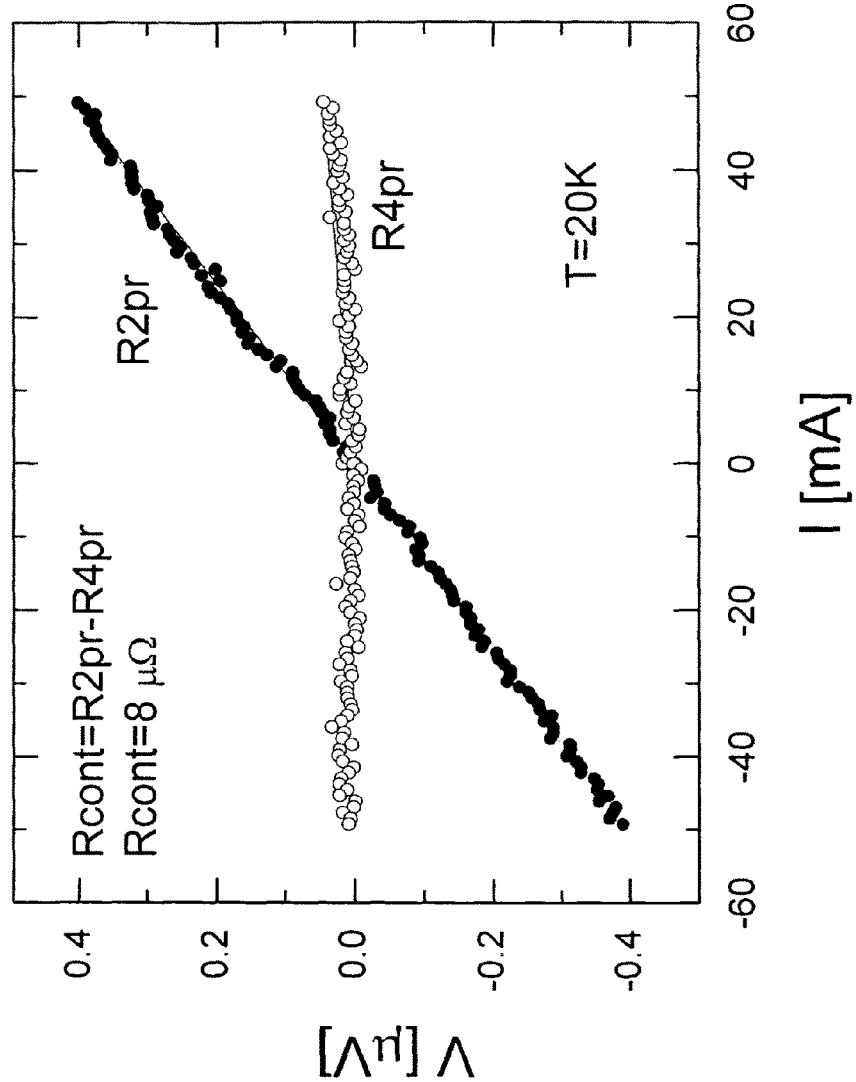
FIG. 3 is a zoom (enlarged) view of the V-I curve measured in the 2-probe configuration, of the data of FIG. 2. Due to the contact resistance, voltage measured in the 2-probe scheme, is finite and obeys Ohm's laws with contact resistance $R=8$ $\mu\Omega$, while the 4-probe measurements detect zero within experimental scatter value.

To obtain a better measurement of contact resistance, V-I (voltage vs. current) characteristics at temperatures below Tc of the compound were measured. Because of the zero resistance of the superconductor sample, finite voltage is generated when making measurements in two-probe technique, due to the resistance of the two contacts. In FIG. 2 a set of V-I curves taken in 2-probe configuration in isothermal conditions is shown. At temperatures above $T_c$, the curves are perfectly linear, as expected from Ohms law. Below $T_c$ the curves reveal nonlinearity due to approach of the critical current density $J_c$. Since critical current density increases on cooling, at 20.1 K (2K below Tc), the measurement setup is not able to supply high enough current to reach $J_c$. Zoom of the curve at 20.1 K, FIG. 3, shows that actually the measured 2-probe resistance, though small, causes linear V-I curve with finite slope (corresponding to the contact resistance $R_c=8$ $\mu\Omega$), as opposed to zero resistance as detected in four-probe measurements. This is due to the resistance of two contacts at the sample ends.

Figures 4A, 4B:
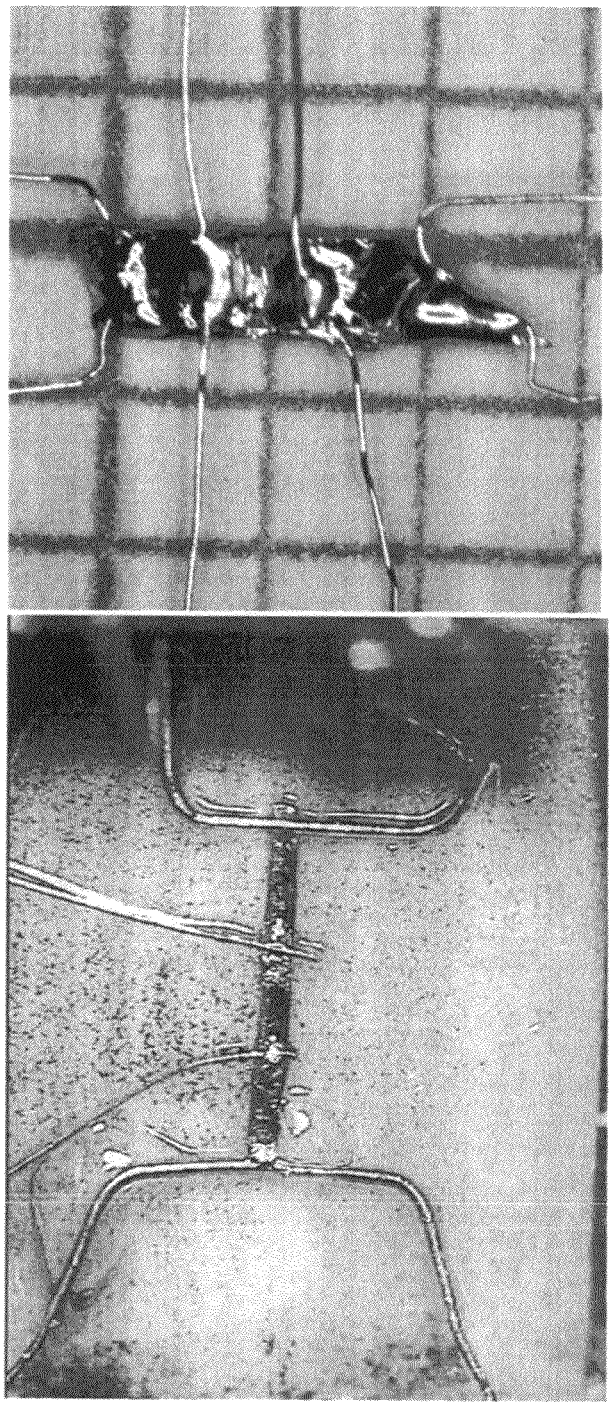
FIGS. 4a and 4b are photographs showing experimental set-up used in contact resistance measurements where current was fed through either the current contacts at the ends of the superconductor sample (FIG. 4a) or potential contacts (FIG. 4b). The areas of the two contacts are $A_1$ and $A_2$: Since contacts are series-connected, measured $R_c=R_1+R_2$. With $R_1=\rho\square/A_1$ and $R2=\rho\square/A_2$, it is not difficult to show that $\rho\square=A_1A_2/(A_1+A_2)$ where $\rho\square$ is contact surface area resistivity.

In FIG. 4a, 4b, photographs of two superconductor samples measured in two-probe measurements between either outer contact pair (FIG. 4a) or central contact pair (FIG. 4b). Since two contacts are series connected, measured resistance $R_c$ is the sum of two contact resistances, $R_1$ and $R_2$.

Taking contact areas of contacts 1 and 2 as $A_1$ and $A_2$, we come to the following relation: $\rho\square = R_c A_1 A_2/(A_1+A_2)$. The experimentally determined values for different contact preparation techniques are summarized in Table 1 where "wire" is the electrical conductor and "alloy" is the solder alloy.

As can be seen in Table 1, use of pure tin solder and of tin alloy solders with Ag, Cu, Ag—Cu and Pb give contact resistivities in the nano$\Omega$-cm$^2$ range ($10^{-9}$ $\Omega$-cm$^2$), comparable to the best examples known for other superconductors, as discussed below.

Sample Preparation for Table 1 Examples

Single crystals of Ba(Fe$_{1-y}$Co$_y$)$_2$As$_2$ were grown out of self flux using conventional high temperature solution growth techniques described in N. Ni et al. Phys. Rev. B 78, 214515 (2008), which is incorporated herein by reference. Small Ba chunks, FeAs powder and CoAs powder were mixed together according to the ratio Ba:FeAs:CoAs=1:4y(1−y):4y. Crystal dimensions can go up to 12*8*1 mm$^3$.

Sample Characterization:

Elemental analysis of the samples was performed using wavelength dispersive x-ray spectroscopy (WDS) in the electron probe microanalyzer of a JEOL JXA-8200 Superprobe. According to elemental analysis these samples have y=0.074, while load during sample growth was y=0.10. They are characterized by $T_c$=22.5K.

Critical current measurements and resistivity measurements were performed using a Quantum, Design (QD) Physical Property Measurement System (PPMS).

Samples were cleaved into rectangular prisms, as shown in FIG. 4a, 4b. Four contacts were arranged in a usual four-probe contact configuration. Four contacts to the samples were made using silver wires attached to the sample using different combinations of soldering alloys and fluxes. In all cases to achieve reproducible results, the contacts were put on a fresh cleaved surface of single crystals of Ba(Fe$_{1-y}$Co$_y$)$_2$As$_2$. Contacts with reasonably low surface resistivity could be made with several soldering alloys based on Sn or ultrahigh purity Sn.

TABLE 1

Characteristics of the electrical contacts to doped AFe$_2$As$_2$ as a function of preparation conditions.

| No Compound | A | Dopant type, x or y | Wire | Alloy | Flux | $R_c$, 20 K $\Omega$ | $A_1$ cm$^2$ | $A_2$ cm$^2$ | $\rho\square$ $\Omega$-cm2 | Reference |
|---|---|---|---|---|---|---|---|---|---|---|
| 1 | Ba | Co, 0.074 | Ag | Sn 99.999% | Castolin 157 | 1.76* $10^{-6}$ | 1.73* $10^{-3}$ | 1.9* $10^{-3}$ | 1.59* $10^{-9}$ | s9151 |
| 2 | Ba | Co, 0.074 | Ag | Silver epoxy | No | 0.404 | 2.76* $10^{-3}$ | 2.49* $10^{-3}$ | 5.24* $10^{-4}$ | s9148 |
| 3 | | Co, 0.074 | Ag | Au Evaporation | Ag paint | 0.1 | 3* $10^{-3}$ | 3.23* $10^{-3}$ | 5.24* $10^{-4}$ | s005 |
| 4 | Ba | Co, 0.074 | Ag | Indalloy 3 In-10% Ag | Castoline 157 | 7.27* $10^{-6}$ | 9.9* $10^{-4}$ | 9.8* $10^{-4}$ | 4.58* $10^{-9}$ | s9142 |
| 5 | Ba | Co, 0.074 | Ag | Indalloy 3 In-10% Ag | Indalloy 1 | 2.41* $10^{-s4}$ | 1.23* $10^{-3}$ | 4.92* $10^{-4}$ | 2.37* $10^{-8}$ | s9143 |
| 6 | Ba | Co, 0.074 | Ag | Indalloy 3 In-10% Ag | HCl Concentrated | 4.76* $10^{-4}$ | 2.47* $10^{-4}$ | 3.95* $10^{-4}$ | 7.27* $10^{-8}$ | s9143b |
| 7 | Ba | Co, 0.074 | Ag | Indalloy 3 In-10% Ag | Indalloy 2 | Bad | | | | s9144 |
| 8 | Ba | Co, 0.074 | Ag | Indalloy 3 In-10% Ag | Indalloy 3 | Bad | | | | |
| 9 | Ba | Co, 0.074 | Ag | Indalloy 3 In-10% Ag | Indalloy 4 | Bad | | | | s9143d |
| 10 | Ba | Co, 0.074 | Ag | Indalloy 3 In-10% Ag | Indalloy 5A | Bad | | | | s9143c |
| 11 | Ba | Co, 0.074 | Ag | Indalloy 121 Sn-Ag | Indalloy 2 | 7.05* $10^{-6}$ | 1.03* $10^{-3}$ | 1.19* $10^{-3}$ | 3.89* $10^{-9}$ | s9145 |
| 12 | Ba | Co, 0.074 | Ag | Indalloy 121 Sn-Ag | Castolin 157 | 7.73* $10^{-6}$ | 8.7* $10^{-4}$ | 1.30* $10^{-3}$ | 4.03* $10^{-9}$ | s9149 |
| 13 | Ba | Co, 0.074 | Ag | Sn 63% Pb 37% | Castolin 157 | 8.1* $10^{-6}$ | 2.6* $10^{-3}$ | 3.41* $10^{-3}$ | 1.19* $10^{-8s}$ | s9146 |
| 14 | Ba | Co, 0.074 | Ag | Sn 63% Pb 37% | Indalloy 2 | 9.98* $10^{-6}$ | 1.7* $10^{-3}$ | 1.76* $10^{-3}$ | 8.69* $10^{-9}$ | s9147 |
| 15 | Ba | K, 0.30 | Ag | Indalloy 121 | Castolin 157 | 9.93* $10^{-5}$ | 5.1* $10^{-4}$ | 6.4* $10^{-4}$ | 2.81* $10^{-8}$ | s9150 |

TABLE 1-continued

Characteristics of the electrical contacts to doped $AFe_2As_2$ as a function of preparation conditions.

| No Compound | Dopant type, A | x or y | Wire | Alloy | Flux | $R_c$, 20 K $\Omega$ | $A_1$ cm$^2$ | $A_2$ cm$^2$ | $\rho\square$ $\Omega$-cm2 | Reference |
|---|---|---|---|---|---|---|---|---|---|---|
| 16 | Ba | Ni, 0.05 | Ag | Indalloy 121 | Castolin 157 | 4.23*10$^{-4}$ | 2.19*10$^{-3}$ | 4.03*10$^{-3}$ | 6*10$^{-7}$ | s9153 |
| 17 | Ba | Co, 0.074 | Ag | In 99.99% | Castolin 157 | 1.85*10$^{-4}$ | 1.19*10$^{-3}$ | 1.19*10$^{-3}$ | 1.1*10$^{-7}$ | s9152 |
| 18 | Ba | Co, 0.074 | Ag | Sn 97.5% Al 2.5% | Castolin 157 | | | | 5.7*10$^{-9}$ | Average 3 samples |
| 19 | Ba | Co, 0.074 | Ag | Sn 57% Bi 43% | Castolin 157 | | | | 7.2*10$^{-8}$ | Average 3 samples |
| 20 | Ba | Co, 0.074 | Ag | Sn 99% Cu 1% | Castolin 157 | | | | 3.1*10$^{-9}$ | Average 3 samples |
| 21 | Ba | Co, 0.074 | Ag | Sn 99% Dy 1% | Castolin 157 | | | | 1.58*10$^{-8}$ | S10571 |
| 22 | Ba | Co, 0.074 | Ag | Sn 99% Ti 1% | Castolin 157 | | | | 5.8*10$^{-9}$ | Average 2 samples |
| 23 | Ba | Co, 0.074 | Ag | Sn 85% Zn 15% | Castoline 157 | | | | 10$^{-7}$ | Slightly rectifying contacts |
| 24 | Ba | Co, 0.074 | Ag | Ag 4.7% Cu 1.7% Sn-93.6% ternary alloy | | | | | 1.4*10$^{-9}$ | Average 3 samples |

In Table 1, "reference" is sample number and % is weight % for the alloys under Alloy.

The contact resistance thus obtained was in a range of several μΩ and surface resistivity of 1 to $10*10^{-9}$ $\Omega$-cm$^2$.

Example 1 of Table 1

Pure 99.999% tin was used as solder pursuant to the invention and Castoline 157 eutectic flux was used as a flux. Sample surface was covered with acidic flux and soldering was performed by heating sample to a melting point of the Sn. The melt showed very good wetting of the surface and the contact resistivity of the contacts was $1.59*10^{-9}$ $\Omega$-cm$^2$.

Example 11 of Table 1

A commercially available Sn—Ag solder alloy (Indalloy #121) was used pursuant to the invention in combination with Indalloy #2 flux. The alloy was heated to a temperature between liquidus and solidus lines of the composition. The contact resistivity was $3.89*10^{-9}$ $\Omega$-cm$^2$.

Example 12 of Table 1

A commercially available Sn—Ag solder alloy (Indalloy #121) was used pursuant to the invention in combination with Castolin 157 flux. The alloy was heated to a temperature between liquidus and solidus lines of the composition. The contact resistivity was $4.03*10^{-9}$.

Example 20 of Table 1

A eutectic Sn—Cu alloy was used pursuant to the invention in combination with Castolin 157 flux. The alloy was heated to a temperature between liquidus and solidus lines of the composition. The contact resistivity was $3.1*10^{-9}$ $\Omega$-cm$^2$.

Example 24 of Table 1

A patented eutectic Sn—Cu—Ag alloy (Ag-4.7 wt %-Cu-1.7 wt %-Sn-93.6 wt % Sn) was used pursuant to the invention in combination with Castolin 157 flux. The ternary alloy was heated to a temperature between liquidus and solidus lines of the composition. The contact resistivity was $1.4*10^{-9}$ $\Omega$-cm$^2$.

Other commercially available tin-based solder alloys known as Sn63Pb37 (37 weight % Pb and balance Sn) were used pursuant to the invention and produced results which were not too different from using pure tin solder (see Examples 14 and 15 of Table 1).

Example 15 of Table 1

To test if the soldering technique works with compounds in which superconductivity is induced by different dopants, contact resistance of the contacts made following procedures of Example 12 on samples of $(Ba_{1-x}K_x)Fe_2As_2$ were tested pursuant to the invention. The results are shown in Table 1 as Example 15. Contact resistivity was $2.81*10^{-9}$ $\Omega$-cm$^2$. In part this value can be determined by the difference in the initial status of the surface, which was not cleaved but rather degraded due to exposure to air.

In another doping example, samples of $Ba(Fe_{1-y}Ni_y)_2As_2$ were soldered pursuant to the invention following procedure of Example 12. Contact resistivity was determined as $6*10^{-9}$ $\Omega$-cm$^2$.

The Examples shown above illustrate that tin and tin-based alloys provide very low surface resistivity contacts to the superconductors of the $(A_{1-x}D1_x)(Fe_{1-y}D2_y)_2(As_{1-z}D3_z)_2$ type described above.

Although the present invention has been described in connection with certain illustrative embodiments, those skilled in the art will appreciate that changes and modifications can be made therein within the scope of the invention as set forth in the appended claims.

The invention claimed is:

1. A method of making a low resistivity electrical connection between a metallic electrical conductor and an iron pnictide superconductor, comprising connecting the electrical conductor and the iron pnictide superconductor using a tin or tin-based material disposed between the electrical conductor and the iron pnictide superconductor in direct electrical contact with the electrical conductor and the iron pnictide superconductor.

2. The method of claim 1 wherein the tin or tin-based material is a solder that is solidified in contact with the electrical conductor and the superconductor.

3. The method of claim 1 wherein the superconductor is represented by $(A_{1-x}D1_x)(Fe_{1-y}D2_y)_2(As_{1-z}D3_y)_2$ wherein A comprises an alkali earth element selected from the group consisting of Ca, Sr, Ba, Eu, and combinations thereof and x is 0 to 1, y is 0 to 0.4, and z is 0 to 0.6 and wherein D1 is selected from the group consisting of Na, K, Rb, Cs and combinations thereof, D2 is selected from the group consisting of Co, Ni, Pd, Rh, Ru, Pt and combinations thereof, and D3 is selected from the group consisting of P, Te, S, Se, Sb, Bi and combinations thereof.

4. The method of claim 3 wherein y is 0 to 0.2.

5. The method of claim 1 wherein the tin or tin-based material comprises ultrahigh purity tin that is 99.999% by weight tin.

6. The method of claim 1 wherein the tin or tin-based material comprises an alloy of tin and lead, an alloy of tin and copper, an alloy of tin and silver, or a ternary alloy of tin-silver-copper.

7. A low resistivity electrical connection between a metallic electrical conductor and an iron pnictide superconductor wherein the connection comprises a tin or tin-based material disposed between the electrical conductor and the iron pnictide superconductor in direct electrical contact with the electrical conductor and the iron pnictide superconductor.

8. The connection of claim 7 wherein the material comprises a solder that is solidified in contact with the electrical conductor and the superconductor.

9. The connection of claim 7 wherein the superconductor is represented by $(A_{1-x}D1_x)(Fe_{1-y}D2_y)_2(As_{1-z}D3_y)_2$ wherein A comprises an alkali earth element selected from the group consisting of Ca, Sr, Ba, Eu, and combinations thereof and x is 0 to 1, y is 0 to 0.4, and z is 0 to 0.6 and wherein D1 is selected from the group consisting of Na, K, Rb, Cs and combinations thereof, D2 is selected from the group consisting of Co, Ni, Pd, Rh, Ru, Pt and combinations thereof, and D3 is selected from the group consisting of P, Te, S, Se, Sb, Bi and combinations thereof.

10. The connection of claim 9 wherein y is 0 to 0.2.

11. The connection of claim 7 wherein the material comprises ultrahigh purity tin that is 99.999% by weight tin.

12. The connection of claim 7 wherein the material comprises an alloy of tin and lead.

13. The connection of claim 7 wherein the material comprises an alloy of tin and silver.

14. The connection of claim 7 wherein the material comprises an alloy of tin and copper.

15. The connection of claim 7 wherein the material comprises an alloy of tin, copper and silver.

16. The connection of claim 7 wherein the material comprises a tin-based alloy that includes a minor amount of an element selected from the group consisting of Bi, Al, In, Pb, Ag, Au, Cu, Cd, Sb, and Zn.

* * * * *